United States Patent [19]

Choi et al.

[11] Patent Number: 5,734,282

[45] Date of Patent: Mar. 31, 1998

[54] ADDRESS TRANSITION DETECTION CIRCUIT

[75] Inventors: Kyun Kyu Choi; Jang Sub Sohn, both of Seoul, Rep. of Korea

[73] Assignee: LG Semicon Co., Ltd., Cheongju, Rep. of Korea

[21] Appl. No.: 702,378

[22] Filed: Aug. 23, 1996

[30] Foreign Application Priority Data

Dec. 21, 1995 [KR] Rep. of Korea ............... 1995/53433

[51] Int. Cl.$^6$ ............................................. H03K 3/284
[52] U.S. Cl. .......................... 327/227; 327/228; 327/176; 327/26; 365/233.5
[58] Field of Search ............................... 327/227, 228, 327/230, 172, 174, 176, 175, 20, 22, 23, 25, 26, 27; 365/189.08, 194, 233.5

[56] References Cited

U.S. PATENT DOCUMENTS 4,355,283  10/1982  Ott ............................... 328/61
5,625,604   4/1997  Kim et al. ................. 365/233.5

Primary Examiner—Timothy P. Callahan
Assistant Examiner—An T. Luu
Attorney, Agent, or Firm—Fleshner & Kim

[57] ABSTRACT

An improved address transition detection circuit prevents malfunctions of a memory by generating an address transition detection signal having a certain pulse width regardless of the width of a pulse of an address signal inputted to a memory. The circuit includes a NOR-gate for NORing an address signal and a chip selection signal, which are externally applied thereto. A level maintaining unit maintains a level of a signal outputted from the NOR-gate for a predetermined time, in accordance with first and second latch signals and first and second delay signals, to output first and second level maintaining signals of different levels. A latch latches the first and second level maintaining signals outputted from the level maintaining unit and outputs first and second latch signals. First and second signal delay units delay first and second latch signals outputted from the latch for a predetermined time and output first and second delay signals. A signal output unit outputs an address transition detection signal, in accordance with first and second latch signals and first and second delay signals.

24 Claims, 3 Drawing Sheets

FIG.3A
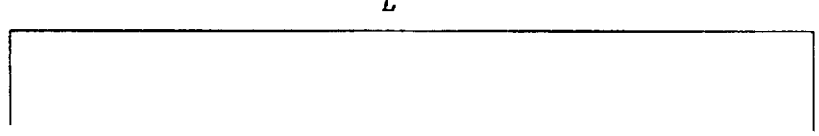
FIG.3B
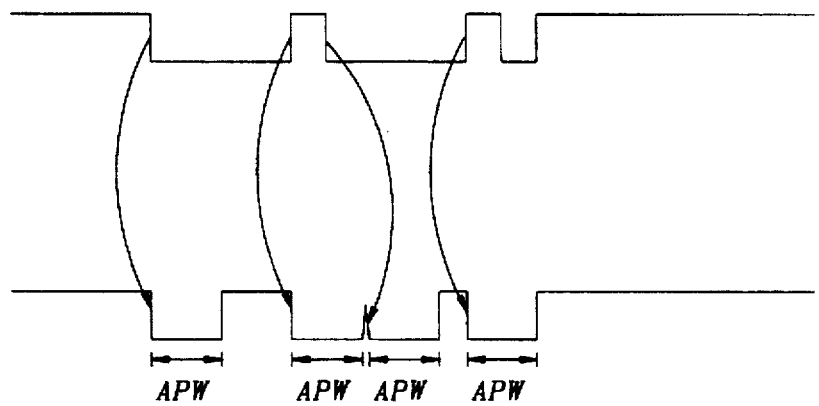
FIG.3C

5,734,282

ADDRESS TRANSITION DETECTION CIRCUIT

TECHNICAL FIELD

The present invention relates to a circuit for detecting a transition of a signal, and particularly to a circuit for generating an address transition detection signal having a prescribed pulse width irrespective of the pulse width of an address signal.

BACKGROUND ART

FIG. 1 shows a conventional address transition detection circuit. A NOR-gate 1 NORs a chip selection signal CSb and an address signal AD inputted thereto, and a latch 2 latches the signal outputted from the NOR-gate 1 to output latch signals LAS1 and LAS2 having an opposed phase. Signal delay units 3 and 4 delay the latch signals LAS1 and LAS2 to output delay signals DLS1 and DLS2, and a signal output unit 5 outputs an address transition detection signal ATDS in accordance with the latch signals LAS1 and LAS2, and the delay signals DLS1 and DLS2.

The latch 2 includes a NAND-gate 22 for NANDing the signal inverted by the inverter 21 and outputted from the NOR-gate 1 and a latch signal LAS2, and a NAND-gate 23 for NANDing the output signals outputted from the NOR-gate 1 and the NAND-gate 22. The signal delay unit 3 includes inverters 31 and 32 for sequentially inverting the latch signal LAS1 outputted from the latch 2. The signal delay unit 4 includes inverters 41 and 42 for sequentially inverting the latch signal LAS2 outputted from the latch 2.

The signal output unit 5 includes a PMOS transistor MP1 with its source terminal connected to a voltage VCC, and its gate terminal connected to the delay signal DLS1 line of the signal delay unit 3. The PMOS transistor MP2 includes a source terminal connected to the drain terminal of the PMOS transistor MP1. Each gate terminal of transistors MP2 and MN1 is commonly connected to the latch signal LAS1 line of the latch 2; and the drain terminals thereof connected to each other and connected to the address transition detection signal ATDS.

An NMOS transistor MN2 includes a drain terminal connected to the source terminal of the NMOS transistor MN1, a gate terminal connected to the delay signal DLS2 line, and a source terminal connected to the ground. A PMOS transistor MP3 has a source terminal connected to the voltage VCC, and a gate terminal connected to the gate terminal of the NMOS transistor MN2. The PMOS transistor MP4 and NMOS transistor MN3 includes a source terminal connected to the drain terminal of the NMOS transistor PM3. Each gate terminal of transistors MP4 and MN3 is commonly connected to the latch signal LAS2 line; and drain terminals thereof are connected to each other and connected to the address transition detection signal ATDS line. An NMOS transistor MN4 has its drain terminal connected to the source terminal of the NMOS transistor MN3, its gate terminal connected to the gate terminal of the PMOS transistor MP1, and its source terminal connected to the ground.

The operation of the conventional address transition detection circuit for a memory will now be explained with reference to the accompanying drawings. At an initial stage, when a chip selection signal CSb of a low level and an address signal AD of a low level are inputted, the NOR-gate 1 NORs the chip selection signal CSb and the address signal AD to output a high level signal. Thereafter, the NAND-gate 22 of the latch 2 receives a low level signal inverted by the inverter 21 outputted from the NOR-gate 1 and outputs a latch signal LAS1 of a high level, regardless of the level of the signal outputted from the NAND-gate 23 and applied to the other terminal thereof.

The NAND-gate 23 NANDs the high level signal outputted from the NOR-gate 1 and a latch signal LAS1 of a high level outputted from the NAND-gate 22 to output a latch signal LAS2 of a low level. The latch signal LAS1 of a high level outputted from the NAND-gate 22 through the inverters 31 and 32 is delayed by the signal delay unit 3 for a predetermined time, and a delay signal DLS1 of a high level is outputted. A latch signal LAS2 of a low level outputted from the NAND-gate 23 through the inverters 41 and 42 is delayed by the signal delay unit 4 for a certain time, and a delay signal DLS2 of a low level signal is outputted.

Thereafter, the PMOS transistor MP1 and the NMOS transistor MN4 of the signal output unit 5 are turned off and turned on, respectively, in accordance with a high level signal. The PMOS transistor MP2 and the NMOS transistor MN1 are turned off and turned on, respectively, in accordance with a high level signal LAS1. Further, the NMOS transistor MN2 and the PMOS transistor MP3 are turned off and turned on, respectively, in accordance with a low level signal DLS2 outputted from the inverters 41 and 42. The PMOS transistor MP4 and the NMOS transistor MN3 are turned on and turned off, respectively, in accordance with a low level signal LAS2. Hence, the signal output unit 5 outputs an address transition detection signal ATDS of a high level through an address transition detection signal ATDS.

When the address signal AD transits from a low level to a high level, and the pulse width of the address signal AD transited to a high level is longer than that of an address transition detection signal required in the memory, and a chip selection signal is a low level, the NOR-gate 1 outputs a low level signal. The NAND-gate 23 NANDs a low level signal outputted from the NOR-gate 1 and a high level signal LAS1 applied thereto from the NAND-gate 22. The NAND-gate 22 NANDs a high level signal inverted by the inverter 21 and a high level signal LAS2 outputted from the NAND-gate 23 to output a low level signal LAS1.

The PMOS transistor MP2 and the NMOS transistor MN1 are turned on and turned off, respectively, in accordance with a low level signal LAS1. The PMOS transistor MP4 and the NMOS transistor MN3 are turned on and turned off, respectively, in accordance with a high level signal LAS2. In addition, the PMOS transistor MP1 and the NMOS transistor MN4 keep a turned-off state and a turned-on state, respectively, which are referred to a switching state before the signals LAS1 and LAS2 from the NAND-gates 22 and 23 are outputted through the signal delay units 3 and 4. The NMOS transistor MN2 and the PMOS transistor MP3 keep a turned-off state and a turned-on state, respectively, of a previous state. Therefore, the high level signal outputted through the address transition detection signal ATDS line transits to a low level signal ATDS.

Thereafter, the low level signal LAS1 from the NAND-gate 22 is outputted through the inverters 31 and 32 as a low level signal, and the high level signal LAS2 from the NAND-gate 23 is outputted through the inverters 41 and 42 as a high level signal DLS2. The PMOS transistor MP1 and the NMOS transistor MN4 are turned on and turned off, respectively, in accordance with a low level signal DLS1. The NMOS transistor MN2 and the PMOS transistor MP3 are turned on and turned off in accordance with a high level signal DLS2.

Further, the PMOS transistor MP2 and the NMOS transistor MN1 keep a turned-on state and a turned-off state, respectively, of a previous switching state, and the PMOS transistor MP4 and the NMOS transistor MN3 keep a turned-on state and a turned-off state of a previous switching state. Therefore, the low level address transition detection signal ATDS is outputted as a high level signal.

When an address signal AD transits from a high level to a low level and a chip selection signal CSb is a low level, the NOR-gate 1 NORs a high level signal. The NAND-gate 23 NANDs a high level signal outputted from the NOR-gate 1 and a low level signal LAS1 outputs a high level signal LAS2. The NAND-gate 22 NANDs a low level signal inverted from a high level signal by the inverter 21 and a low level signal LS2 outputs a high level signal LAS1.

Hence, the PMOS transistor MP2 and the NMOS transistor MN1 are turned off and turned on, respectively, in accordance with a high level signal LAS1. The PMOS transistor MP4 and the NMOS transistor MN3 are turned on and turned off, respectively, in accordance with a low level signal LAS2. The PMOS transistor MP1 and the NMOS transistor MN4 keep a turned-on state and a turned-off state, respectively, of a previous switching state before the signals LAS1 and LAS2 outputted from the NAND-gates 22 and 23 are outputted. The PMOS transistor MP4 and the NMOS transistor MN3 keep a turned-on state and a turned-off state, respectively. Therefore, an address transition detection signal ATDS is outputted as a low level address transition detection signal ATDS.

Thereafter, a high level signal LAS1 outputted from the NAND-gate 22 is delayed by the inverters 31 and 32 for a predetermined time and inverted into a high level signal. A low level signal LAS2 is delayed by the inverters 41 and 42 for a predetermined time and outputted as a low level signal DLS2. The PMOS transistor MP1 and the NMOS transistor MN4 are turned on and turned off, respectively, in accordance with a high level signal DLS1, and the NMOS transistor MN2 and the PMOS transistor MP3 are turned off and turned on, respectively, in accordance with a low level signal DLS2.

The PMOS transistor MP2 and the NMOS transistor MN1 keep a turned-off state and a turned-on state, respectively, of a previous switching state. The PMOS transistor MP4 and the NMOS transistor MN3 keep a turned-on state and a turned-off state, respectively. Hence, an address transition detection signal ATDS outputted from an address transition detection signal ATDS transits to a high level.

When the address signal AD transits from a low level to a high level, the pulse width of the address transition detection signal ATDS is determined in accordance with a delay time of the signal delay unit 3. When the address signal AD transits from a high level to a low level, the pulse width of the address transition detection signal ATDS is determined in accordance with a delay time of the signal delay unit.

Meanwhile, when an address signal AD having a certain pulse width shorter than the pulse width of a high level address transition detection signal ATDS, which is required in the memory, is inputted to an address transition detection circuit, the same operation is performed as was explained above. An address transition detection signal ATDS of a low level, having a certain pulse width shorter than the pulse width of the address AD signal required in the memory, is outputted through the address transition detection signal ATDS line.

However, when an address signal having a certain pulse width shorter than the pulse width of the address transition detection signal required in the memory is inputted, i.e., when a certain address signal having the pulse width shorter than that in accordance with a delay time of the signal delay unit, the operation of the memory becomes unstable due to an abnormal address signal input.

Disclosure of the Invention

Accordingly, it is an object of the present invention to provide an address transition detection circuit, which overcomes the problems encountered in a conventional address transition detection circuit for a memory.

It is another object of the present invention to provide an improved address transition detection circuit to prevent malfunctions of a memory.

An advantage of the present invention is in generating an address transition detection signal having a certain pulse width regardless of the width of a pulse of an address signal.

To achieve the above objects, there is provided an address transition detection circuit for a memory, which includes a NOR-gate for NORing an address signal and a chip selection signal, which are externally applied thereto; a level maintaining unit for maintaining a level of a signal outputted from the NOR-gate for a predetermined time in accordance with first and second latch signals and first and second delay signals and for outputting first and second level maintaining signals of different levels; a latch for latching the first and second level maintaining signals outputted from the level maintaining unit and for outputting first and second latch signals; first and second signal delay units for delaying first and second latch signals outputted from the latch for a predetermined time and outputting first and second delay signals; and a signal output unit for outputting an address transition detection signal in accordance with first and second latch signals outputted from the latch and first and second delay signals outputted from the first and second signal delay units.

The present invention can be also achieved in part by a circuit for generating a signal of a predetermined width in response to a transition of an input signal, comprising: a level maintaining circuit having a plurality of transistors coupled to be responsive to the input signal such that a first signal is outputted by the plurality of transistors; a latch circuit coupled to the level maintaining circuit such that the latch circuit latches the first signal and outputs a second signal; a delay circuit receiving the second signal such that the second signal is delayed for a predetermined period of time; and an output circuit receiving a delayed second signal from the delay circuit whereby the output circuit provides the signal of the predetermined width in response to the transition of the input signal, wherein the second signal and the delayed second signal are applied to the plurality of transistors of the level maintaining circuit and the output circuit.

The foregoing objects and advantages are achieved at least in part by a circuit for generating an address transition detection signal of a predetermined pulse width in response to a transition of an input signal, comprising: a level maintaining circuit having a first set of serially connected transistors responsive to the input signal to output a first level maintaining signal and a second set of serially connected transistors responsive to the input signal to output a second level maintaining signal; a latch circuit coupled to the level maintaining circuit such that the latch circuit latches the first and second level maintaining signals and outputs first and second latch second signals; a delay circuit receiving the first and second latch signals such that the first and second latch signals are delayed for a predetermined period of time; and an output circuit receiving delayed first and second latch signals from the delay circuit whereby the output circuit provides the address transition detection signal of the predetermined width in response to the transition of the input signal, wherein the first latch signal and the delayed second latch signal are applied to the first set, and the second latch signal and the delayed first latch signal are applied to the second set.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A through 3C are wave forms of each element of FIG. 2 according to the present invention.

BEST MODE FOR CARRYING OUT THE INVENTION

Figure 1:
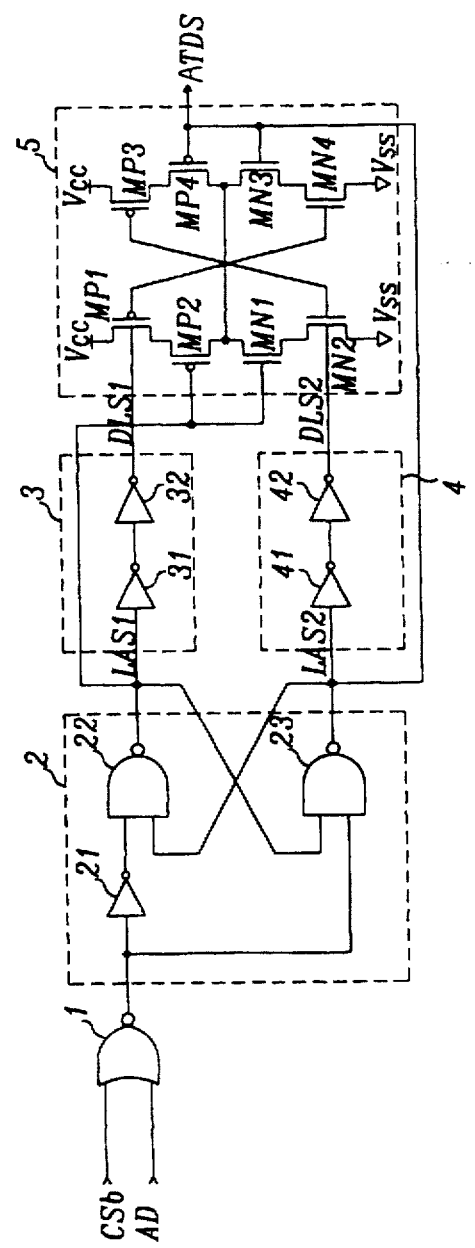
FIG. 1 is a circuit diagram of a conventional address transition detection circuit for a memory.
Figure 2:
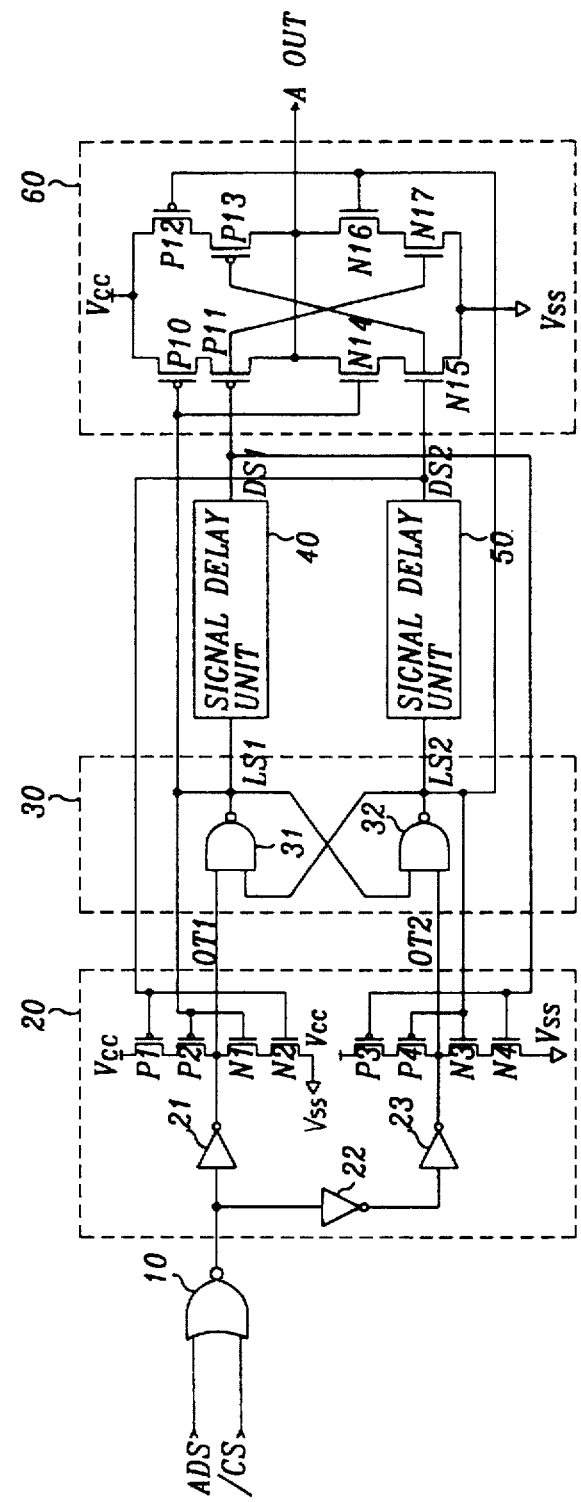
FIG. 2 is a circuit diagram of an address transition detection circuit for a memory according to the present invention.

FIG. 2 shows an address transition detection circuit for a memory according to the present invention. A NOR-gate NORs an address signal ADS and a chip selection signal /CS, and a level maintaining unit 20 maintains the level of a signal outputted from the NOR-gate 10 in accordance with feeding-back latch control signals LS1 and LS2 and delay signals DS1 and DS2 and outputs level maintaining signals OT1 and OT2 having different levels. A latch 30 latches the level maintaining signals OT1 and OT2 outputted from the level maintaining unit 20 and outputs latch signals LS1 and LS2 having different levels. Signal delay units 40 and 50 delay the latch signals LS1 and LS2 outputted from the latch 30 for a predetermined time and outputs delay signals DS1 and DS2. A signal output unit 60 outputs an address transition detection signal AOUT in accordance with latch signals LS1 and LS2 and delay signals DS1 and DS2.

The level maintaining unit 20 includes inverters 21 and 22 connected to the output line of the NOR-gate 10, and an inverter 23 having the input terminal connected to the output terminal of the inverter 22 and first and second sets of serially connected transistors. The first set includes PMOS transistors P1 and P2 and NMOS transistors N1 and N2. Similarly, the second set includes PMOS-transistors P3 and P4 and NMOS transistors N3 and N4.

A PMOS transistor P1 has a source terminal connected to a voltage VCC, and a gate terminal connected to a delay signal DS2 line, and a PMOS transistor P2 includes a source terminal connected to the drain terminal of the PMOS transistor P1, a gate terminal connected to a latch signal LS1 line, and a drain terminal connected to the output terminal of the inverter 21. The NMOS transistor N1 has a drain terminal connected to a drain terminal of the PMOS transistor P2 and connected to a level maintaining signal OT1 line, and a gate terminal connected to the gate terminal of the PMOS transistor P2. The NMOS transistor N2 includes a drain terminal connected to the source terminal of the NMOS transistor N1, a gate terminal connected to the gate terminal of the PMOS transistor P1, and a source terminal connected to the ground.

The PMOS transistor P3 includes a source terminal connected to the voltage VCC, and a gate terminal connected to a delay signal DS1 line, and the PMOS transistor P4 has a source terminal connected to the drain terminal of the PMOS transistor P3, and a drain terminal connected to the output terminal of the inverter 23. The NMOS transistor N3 includes a drain terminal connected to the drain terminal of the PMOS transistor P3, and a drain terminal connected to the output terminal of the inverter 23. The NMOS transistor N3 includes a drain terminal connected to the drain terminal of the PMOS transistor P4 and a level maintaining signal OT2 line and a gate terminal connected to the gate terminal of the PMOS transistor P4. The NMOS transistor N4 has a drain terminal connected to the source terminal of the NMOS transistor N3, a gate terminal connected to the gate terminal of the PMOS transistor P3, and a source terminal connected to the ground.

The latch 30 latches the signal OT1 and OT2 from the level maintaining unit 20. A NAND-gate 31 NANDs a level maintaining signal OT1 outputted from the level maintaining unit 20 and a latch signal LS2 of an output signal thereof to output a latch signal LS1. A NAND-gate 32 NANDs a latch signal LS1 outputted from the NAND-gate 31 and a level maintaining signal OT2 outputted from the level maintaining unit 20. The delay units 40 and 50 are similar to delay units 3 and 4, and the description is omitted for convenience.

The signal output unit 60 comprises a first group of transistors P10, P11, P12 and P13, and a second group of transistors N14, N15, N16 and N17. The PMOS transistor P10 has the source terminal connected to a voltage VCC, and a gate terminal connected to a latch signal LS1 line, and the PMOS transistor P11 has a source terminal connected to the drain terminal of the PMOS transistor P10, and a gate terminal connected to a delay signal DS1 line. The NMOS transistor N14 includes a drain terminal connected to the drain terminal of the PMOS transistor P11 and connected to an address transition detection signal AOUT line, and a gate terminal connected to the gate terminal of the PMOS transistor P10. The NMOS transistor N15 has a drain terminal connected to the source terminal of the NMOS transistor N14, a gate terminal connected to a delay signal DS2, and a source terminal connected to the ground.

The PMOS transistor P12 includes a source terminal connected to the source terminal of the PMOS transistor P10, and a gate terminal connected to a latch signal LS2 line. The PMOS transistor P13 comprises a source terminal connected to the drain terminal of the PMOS transistor P12, and a gate terminal connected to the gate terminal of the NMOS transistor N15. The NMOS transistor N16 comprises a drain terminal connected to the drain terminal of the PMOS transistor P13 and an address transition detection signal AOUT, and a gate terminal connected to the gate terminal of the PMOS transistor P12. The NMOS transistor N17 includes a drain terminal connected to the source terminal of the NMOS transistor 16, a gate terminal connected to the gate terminal of the PMOS transistor P11, and a source terminal connected to the ground.

The operation of an address transition detection circuit for a memory according to the present invention will now be explained with reference to FIGS. 3A through 3C. To begin with, when a chip selection signal /CS of a low level L and an address signal ADS of a high level are inputted to the NOR-gate 10, respectively, the NOR-gate 10 NORs the signals /CS and ADS and outputs a low level signal. The low level signal outputted from the NOR-gate 10 is outputted through the inverter 21 of the level maintaining unit 20 as a high level signal OT1 and outputted through the inverters 22 and 23 as a low level signal OT2.

The NAND-gate 32 of the latch 30 receives a low level signal OT2 outputted from the inverter 23 through an input terminal thereof and outputs a high level signal regardless of the latch signal LS1 applied to another input terminal thereof. The NAND-gate 31 NANDs a high level signal OT1 outputted from the inverted 21 and applied thereto through an input terminal thereof and a high level signal LS2 outputted from the NAND-gate 32 and applied thereto through another input terminal thereof and outputs a low level signal LS1. Thereafter, the signal delay units 40 and 50 delay a low level signal LS1 and a high level signal LS2 outputted from the NAND-gates 31 and 32, respectively, and outputs a delay signal DS1 of a low level and a delay signal DS2 of a high level.

The PMOS transistor P10 and the NMOS transistor N14 of the signal output unit 60 are turned on and turned off, respectively, in accordance with a low level signal LS1 outputted from the NAND-gate 31. The PMOS transistor P11 and the NMOS transistor N17 are turned on and turned off, respectively, in accordance with a low level signal DS1 outputted from the signal delay unit 40 and applied thereto through the gate terminals thereof.

The NMOS transistor N15 and the PMOS transistor P13 are turned on and turned off, respectively, in accordance with a high level signal DS2 outputted from the signal delay unit 50 and applied thereto through the gate terminals thereof. The PMOS transistor P12 and the NMOS transistor N16 are turned off and turned on, respectively, in accordance with a high level signal LS2 outputted from the NAND-gate 32 and applied thereto through the gate terminals thereof. Thereafter, when an address signal ADS as shown in FIG. 3B is transited from a high level to a low level and is inputted to an input terminal of the NOR-gate 10, the NOR-gate 10 NORs an address signal ADS of a low level and a low level signal /CS applied to another input terminal thereof and outputs a high level signal.

The high level signal outputted from the NOR-gate 10 is inverted into a low level signal by the inverter 21, and the low level signal is inverted into a high level signal by the inverters 22 and 23. At this time, the PMOS transistor P1 and the NMOS transistor N2 are turned off and turned on, respectively, in accordance with a high level signal DS2 outputted from the signal delay unit 50 by receiving it through the gate terminals thereof. The PMOS transistor P2 and the NMOS transistor N1 are turned on and turned off, respectively, in accordance with a low level signal outputted from the NAND-gate 31 by receiving it through the gate terminals thereof. Therefore, the low level signal outputted from the inverter 21 is outputted as a low level signal OT1.

Further, the PMOS transistor P3 and the NMOS transistor N4 are turned on and turned off, respectively, in accordance with a low level signal DS1 outputted from the signal delay unit 40 by receiving it through the gate terminals thereof. The PMOS transistor P4 and the NMOS transistor N3 are turned off and turned on in accordance with a high level signal LS2 outputted from the NAND-gate 32 by receiving it through the gate terminals thereof. Hence, the high level signal outputted from the inverter 23 is outputted as a high level signal OT2.

Thereafter, the NAND-gate 31 receives a low level signal OT1 outputted from the level maintaining unit 20 through an input terminal thereof, and a high level signal LS2 outputted from the NAND-gate 32 through another input terminal thereof and outputs a high level signal LS1. The NAND-gate 32 NANDs a high level signal OT2 outputted from the level maintaining unit 20 by receiving it through an input terminal thereof and a high level signal LS1 outputted from the NAND-gate and outputs a low level signal LS2 by receiving it through another input terminal thereof.

The PMOS transistor P10 and the NMOS transistor N14 of the signal output unit 60 are turned off and turned on, respectively, in accordance with a high level signal LS1 outputted from the NAND-gate 31 by receiving it through the gate terminals thereof. The PMOS transistor P12 and NMOS transistor N16 are turned on and turned off, respectively, in accordance with a low level signal LS2 outputted from the NAND-gate 32 by receiving it through the gate terminals thereof.

The PMOS transistor P11 and the NMOS transistor N17 maintain a turned-on state and a turned-off state, which are referred to a previous switching state, until high level signals LS1 and LS2 outputted from the NAND-gates 31 and 32 are outputted from the signal delay units 40 and 50. The NMOS transistor N15 and the PMOS transistor P13 maintain a turned-on state and a turned-off state, respectively, which are referred to a previous state. Therefore, the signal output unit 60, which outputted a high level signal, outputs an address transition detection signal AOUT of a low level.

At this time, the PMOS transistor P2 and the NMOS transistor N1 are turned off and turned on in accordance with a high level signal LS1 outputted from the NAND-gate 31 by receiving it through the gate terminals thereof. The PMOS transistor P4 and the NMOS transistor N3 are turned on and turned off in accordance with a low level signal LS2 outputted from the NAND-gate 32 by receiving it through the gate terminals thereof.

Further, the PMOS transistor P1 and the NMOS transistor N2 maintains a turned-off state and a turned-on state of a previous switching state until a high level signal LS1 and a low level signal LS2 outputted from the NAND-gates 31 and 32 are outputted from the signal delay units 40 and 50, respectively. The PMOS transistor P3 and the NMOS transistor N4 maintain a turned-on state and a turned-off state, respectively. The NAND-gates 31 and 32 output a high level signal LS1 and a low level signal LS2, respectively.

When the signal delay units 40 and 50 delay the high level signal LS1 and the low level signal LS2 and output a high level signal DS1 and a low level signal DS2, respectively, the PMOS transistor P11 and the NMOS transistor N17 are turned off and turned on, respectively, in accordance with a high level signal DS1 outputted from the signal delay unit 40 by receiving it through the gate terminals thereof. The NMOS transistor N15 and the PMOS transistor P13 are turned off and turned on, respectively, in accordance with a low level signal DS2 outputted from the signal delay unit 50 by receiving it through the gate terminals thereof.

Further, the PMOS transistor P10 and the NMOS transistor N14 maintain a turned-off state and a turned-on state, respectively, of a previous switching state. The PMOS transistor P12 and the NMOS transistor N16 maintain a turned-on state and a turned-off state of a previous state. Therefore, the signal output unit 60, which outputted a low level signal, outputs an address transition detection signal AOUT of a high level.

At this time, the PMOS transistor P1 and the NMOS transistor N2 are turned on and turned off, respectively, in accordance with a low level signal DS2 outputted from the signal delay unit 50 by receiving it from the gate terminals thereof. The PMOS transistor P3 and the NMOS transistor N4 are turned off and turned on, respectively, in accordance with a high level signal DS1 outputted from the signal delay unit 50 by receiving it from the gate terminals thereof.

The PMOS transistor P2 and the NMOS transistor N1 maintain a turned-off state and a turned-on state, respectively, and the PMOS transistor P4 and the NMOS transistor N3 maintain a turned-on state and a turned-off state, respectively. Therefore, since the level maintaining unit 20 continuously outputs a low level signal OT1 and a high level signal OT2, the latch 30, the signal delay units 40 and 50, and the signal output unit 60 are operated in the above-mentioned methods. As a result, when a normal address signal is transited from a high level to a low level, an address transition detection signal AOUT of a low level having a predetermined pulse width, which is required in the memory as shown in FIG. 3C, is generated.

As shown in FIG. 3C, when the address signal ADS is transited from a low level to a high level and inputted to an input terminal of the NOR-gate 10, the NOR-gate 10 NORs an address signal ADS of a high level signal inputted thereto and a low level signal /CS inputted thereto through another input terminal thereof and outputs a low level signal. The low level signal outputted from the NOR-gate 10 is converted into a high level signal by the inverter 21 and the high level signal thereof is converted into a low level signal by the inverters 22 and 23.

Since the PMOS transistor P3 and the NMOS transistor N4 maintain a turned-off state and a turned-on state, respectively, of a previous switching state, and the PMOS transistor P4 and the NMOS transistor N3 maintain a turned-on state and a turned-off state, respectively, the low level signal outputted from the inverter 23 is outputted as a low level signal. Thereafter, the NAND-gate 32 NANDs a low level signal OT2 outputted from the level maintaining unit 20 and a high level signal LS1 outputted from the NAND-gate 31 to output a high level signal LS2.

Further, the NAND-gate 31 NANDs a high level signal OT1 outputted from the level maintaining unit 20 by receiving it through an input terminal thereof and a high level signal LS2 outputted from the NAND-gate 32 by receiving it through another input terminal thereof. Thereafter, the PMOS transistor P10 and the NMOS transistor N14 are turned on and turned off, respectively, in accordance with a low level signal LS1. The PMOS transistor P12 and the NMOS transistor N16 are turned off and turned on, respectively, in accordance with a high level signal LS2.

The PMOS transistor P11 and the NMOS transistor N17 maintain a turned-off state and a turned-on state, respectively, of a previous switching state, and the NMOS transistor N15 and the PMOS transistor P13 maintain a turned-off state and a turned-on state of a previous switching state. Therefore, the signal output unit 60, which outputted a high level signal, outputs an address transition detection signal AOUT of a low level.

At this time, the PMOS transistor P2 and the NMOS transistor N1 are turned on and turned off, respectively, in accordance with a low level signal LS1. The PMOS transistor P4 and the NMOS transistor N3 are turned off and turned on, respectively, in accordance with a high level signal LS2. Further, the PMOS transistor P1 and the NMOS transistor N2 maintain a turned-on state and a turned-off state, respectively, of a previous switching state. The PMOS transistor P3 and the NMOS transistor N4 also maintain a turned-off state and a turned-on state, respectively, of a previous switching state.

As shown in FIG. 3B, when an address signal ADS is transited from a high level to a low level, and inputted to an input terminal of the NOR-gate 10, the NOR-gate 10 NORs an address signal ADS of a low level and a low level signal /CS to output a high level signal. The high level signal outputted from the NOR-gate 10 is converted into a low level signal by the inverter 21, and the low level signal thereof is converted into a high level signal by the inverters 22 and 23.

Since the PMOS transistors P1 and P2 maintain a turned-on state, and the level maintaining unit 20 continuously outputs a high level signal OT1, and the NMOS transistors N3 and N4 maintain a turned-on state, the high level signal outputted from the inverter 23 is applied to the NMOS transistors N3 and N4, and the level maintaining unit 20 outputs a low level signal OT2. Hence, the NAND-gates 31 and 32 output a low level signal LS1 and a high level signal LS2, respectively.

When the low level signal LS1 and the high level signal LS2 are delayed by the signal delay units 40 and 41 for a predetermined time, and a low level signal DS1 and a high level signal DS2 are outputted therefrom, the PMOS transistor P11 and the NMOS transistor N17 are turned on and turned off, respectively, in accordance with a low level signal DS1. In addition, the NMOS transistors N15 and P13 are turned on and turned off, respectively, in accordance with a high level signal DS2.

In addition, the PMOS transistor P10 and the NMOS transistor N14 maintain a turned-on state and a turned-off state, respectively, of a previous switching state. Likewise, the PMOS transistor P12 and the NMOS transistor N16 maintain a turned-off state and a turned-on state, respectively, which are referred to a previous switching state. Therefore, the signal output unit 60, which outputted a low level signal, outputs an address transition detection signal AOUT of a high level.

At this time, the PMOS transistor P1 and the NMOS transistor N2 are turned off and turned on, respectively, in accordance with a high level signal DS2, and the PMOS transistor P3 and the NMOS transistor N4 are turned on and turned off, respectively, in accordance with a low level signal DS1. The PMOS transistor P2 and the NMOS transistor N1 maintain a turned-on state and a turned-off state, respectively, of a previous switching state. The PMOS transistor P4 and the NMOS transistor N3 maintain a turned-off state and a turned-on state, respectively, of a previous switching state. Hence, the low level signal outputted from the inverter 21 is outputted as a low level signal OT1, and the high level signal outputted from the inverter 23 is outputted as a high level signal OT2.

The NAND-gates 31 and 32 output a high level signal LS1 and a low level signal LS2, respectively, as described above. Therefore, the PMOS transistor P10 and the NMOS transistor N14 are turned off and turned on, respectively, in accordance with a high level signal LS1. The PMOS transistor P12 and the NMOS transistor N16 are turned on and turned off in accordance with a low level signal LS2 outputted from the NAND-gate 32.

In addition, the PMOS transistor P11 and the NMOS transistor N17 maintain a turned-on state and a turned-off state, respectively, of a previous switching state. Similarly, the NMOS transistor N15 and the PMOS transistor P13 maintain a turned-on state and a turned-off state, respectively, of a previous switching state. At this time, the PMOS transistor P2 and the NMOS transistor N1 are turned off and turned on, respectively, in accordance with a high level signal LS1. The PMOS transistor P4 and the NMOS transistor N3 are turned on and turned off, respectively, in accordance with a low level signal LS2.

Further, the PMOS transistor P1 and the NMOS transistor N2 maintain a turned-off state and a turned-on state, respectively, of a previous switching state. The PMOS transistor P3 and the NMOS transistor N4 also maintain a turned-on state and a turned-off state, respectively, of a previous switching state. Therefore, the level maintaining unit 20 continuously outputs a low level signal OT1 and a high level signal OT2, and the NAND-gates 31 and 32 continuously output a high level signal LS1 and a low level signal LS2.

Thereafter, a high level signal LS1 and a low level signal LS2 are delayed by the signal delay units 40 and 50 for a predetermined time, and a high level signal DS1 and a low level signal DS2 are outputted therefrom. The PMOS transistor P11 and the NMOS transistor N17 are turned off and turned on, respectively, in accordance with a high level signal DS1 outputted from the signal delay unit 40.

In addition, the NMOS transistor N15 and the PMOS transistor P13 are turned off and turned on, respectively, in accordance with a low level signal DS2 outputted from the signal delay unit 50. Further, the PMOS transistor P10 and the NMOS transistor N14 maintain a turned-off state and a turned-on state of a previous switching state. The PMOS transistor P12 and the NMOS transistor N16 also maintain a turned-on state and a turned-off state of a previous switching state.

Therefore, the signal output unit 40 outputs an address transition detection signal AOUT of a high level. At this time, the PMOS transistor P1 and the NMOS transistor N2 are turned on and turned off, respectively, in accordance with a low level signal DS2 and the PMOS transistor P3 and the NMOS transistor N4 are turned off and turned on, respectively, in accordance with a high level signal DS1. In addition, the PMOS transistor P2 and the NMOS transistor N1 maintain a turned-off state and a turned-on state, respectively, of a previous switching state. The PMOS transistor P4 and the NMOS transistor N3 maintain a turned-on state and a turned-off state, respectively, of a previous switching state.

Therefore, the level maintaining unit 20 continuously outputs a low level signal OT1 and a high level signal OT2. Since the latch 30, the signal delay units 40 and 50 and the signal output unit 60 are operated in the above-mentioned method, and the signal output unit 60 continuously outputs a high level signal AOUT.

When an address signal ADS is inputted to an address transition detection circuit, the address transition detection circuit, as shown in FIG. 3C, generates two address transition detection signals of a low level having a certain pulse width APW. Thereafter, as shown in FIG. 3B, after an address signal ADS is transited from a low level to a high level, the address transition detection circuit will not omit the detection of the address signal ADS during transition from a high level to a low level.

When the address signal ADS transits from a low level to a high level, the NOR-gate 10 NORs an address signal ADS of a high level and a low level signal /CS to output a low level signal. The low level signal outputted from the NOR-gate 10 is inverted into a high level signal by the inverter 21, and inverted into a low level signal by the inverters 22 and 23.

The PMOS transistor P1 and the NMOS transistor N2 maintain a turned-on state and a turned-off state, respectively, of a previous switching state. The PMOS transistor P2 and the NMOS transistor N1 maintain a turned-off state and a turned-on state, respectively, of a previous switching state, and the high level signal outputted from the inverter 21 becomes a high level signal OT1. The PMOS transistor P3 and the NMOS transistor N4 maintain a turned-on state and a turned-off state, respectively, of a previous switching state, and the PMOS transistor P4 and the NMOS transistor N3 maintain a turned-on state and a turned-off state, respectively, which are referred to a previous switching state, and the low level signal outputted from the level maintaining unit 20 becomes a low level signal OT2.

Thereafter, the NAND-gate 32 NANDs a low level signal OT2 and a high level signal LS1 outputted from the NAND-gate 31 to output a high level signal LS2. Further, the NAND-gate 31 NANDs a high level signal OT1 and a high level signal LS2 outputted from the NAND-gate 32 to output a low level signal LS1.

The PMOS transistor P10 and the NMOS transistor are turned on and turned off, respectively, in accordance with a low level signal LS1. The PMOS transistor P12 and the NMOS transistor N16 are turned off and turned on, respectively, in accordance with a high level signal LS2. Further, the PMOS transistor P11 and the NMOS transistor N17 maintain a turned-off state and a turned-on state, respectively, of a previous switching state. The NMOS transistor N15 and the PMOS transistor P13 maintain a turned-off state and a turned-on state, respectively, of a previous switching state. Therefore, the signal output unit 60 continuously outputs an address transition detection signal AOUT of a low level.

After a low level signal LS1 and a high level signal LS2 are delayed by the signal delay units 40 and 41 for a predetermined time, and when the low level signal DS1 and the high level signal DS2 are outputted, the PMOS transistor P11 and the NMOS transistor N17 are turned on and turned off, respectively, in accordance with a low level signal DS1. In addition, the NMOS transistor N15 and the PMOS transistor P13 are turned on and turned off, respectively, in accordance with a high level signal DS2.

The PMOS-transistor P10 and the NMOS transistor N14 maintain a turned-on state and a turned-off state, respectively, of a previous switching state. The PMOS transistor P12 and the NMOS transistor N16 maintain a turned-off state and a turned-on state, respectively, of a previous switching state. Therefore, the signal output unit 60, which outputted a low level signal, outputs an address transition detection signal AOUT of a high level.

As shown in FIG. 3C, when a short address signal ADS of a high level and a low level are inputted to the address transition detection signal, the address transition detection circuit, as shown in FIG. 3C, outputs an address transition detection signal AOUT of a low level. As described above, the address transition detection circuit for a memory according to the present invention is directed, to performing a more stable operation of an internal circuit of a memory by generating an address transition detection signal having a certain pulse width which is required for a stable internal circuit of the same when a short address signal is inputted to the memory.

Although the preferred embodiments of the present invention have been disclosed for illustrative purposes, those skilled in the art will appreciate that various modifications, additions and substitutions are possible, without departing from the scope and spirit of the invention as described in the accompanying claims.

We claim:

1. An address transition detection circuit for a memory, comprising:

a NOR-gate for NORing an address signal and a chip selection signal, which are externally applied thereto;

level maintaining means for maintaining a level of a signal outputted from said NOR-gate for a predetermined time in accordance with first and second latch signals and first and second delay signals and for outputting first and second level maintaining signals of different levels;

a latch for latching said first and second level maintaining signals outputted from said level maintaining means and for outputting said first and second latch signals;

first and second signal delay means for delaying first and second latch signals outputted from said latch for a predetermined time and outputting said first and second delay signals; and signal output means for outputting an address transition detection signal in accordance with first and second latch signals outputted from the latch and first and second delay signals outputted from said first and second signal delay means.

2. The circuit of claim 1, wherein said level maintaining means includes:

first and second inverters having input terminals connected to an output line of the NOR-gate;

a third inverter having an input terminal connected to an output terminal of said second inverter;

a first PMOS transistor having a source terminal connected to a voltage and a gate terminal connected to a second delay signal line of the second signal delay means;

a second PMOS transistor having a source terminal connected to a drain terminal of first PMOS transistor, a gate terminal connected to a first latch signal line of the latch, and a drain terminal connected to an output terminal of the first inverter;

a first NMOS transistor having a drain terminal connected to the drain terminal of said second PMOS transistor and connected to a first level maintaining signal line, and a gate terminal connected to the gate terminal of the second PMOS transistor;

a second NMOS transistor having a drain terminal connected to the source terminal of said first NMOS transistor, a gate terminal connected to the gate terminal of the first PMOS transistor, and a source terminal connected to a ground;

a third PMOS transistor having a source terminal connected to a voltage, and a gate terminal connected to a first delay signal line of the first signal delay means;

a fourth PMOS transistor having a source terminal connected to the drain terminal of said third PMOS transistor, a gate terminal connected to a second latch signal line, and a drain terminal connected to an output terminal of the third inverter;

a third NMOS transistor having a drain terminal connected to the drain terminal of said fourth PMOS transistor and connected to a second level maintaining signal line, and the gate terminal connected to a gate terminal of the fourth PMOS transistor; and a fourth NMOS transistor having a drain terminal connected to the source terminal of said third NMOS transistor, a gate terminal connected to the gate terminal of the third PMOS transistor, and a source terminal connected to a ground.

3. The circuit of claim 1, wherein said latch includes:

a first NAND-gate for NANDing a first level maintaining signal outputted from the level maintaining means and a second latch signal for outputting a first latch signal; and a second NAND-gate for NANDing the first latch signal outputted from said first NAND-gate and a second level maintaining signal outputted from the level maintaining means and for outputting the second latch signal.

4. The circuit of claim 1, wherein said signal output means includes:

a first PMOS transistor having a source terminal connected to a voltage, and a gate terminal connected to a first latch signal line of the latch;

a second PMOS transistor having a source terminal connected to the drain terminal of said first PMOS transistor, and a gate terminal connected to a first delay signal line of the first signal delay means;

a first NMOS transistor having a drain terminal connected to the drain terminal of said second PMOS transistor, and a gate terminal connected to the gate terminal of the first PMOS transistor;

a second NMOS transistor having a drain terminal connected to the source terminal of said first NMOS transistor, a gate terminal connected to a second delay signal line of the second signal delay means, and a source terminal connected to a ground;

a third PMOS transistor having a source terminal connected to the source terminal of the first PMOS transistor, and a gate terminal connected to a second latch signal line of the latch;

a fourth PMOS transistor having a source connected to the drain terminal of said third PMOS transistor, and a gate terminal connected to the gate terminal of the second NMOS transistor;

a third NMOS transistor having a drain terminal connected to the drain terminal of said fourth PMOS transistor and connected to an address transition detection signal line, and a gate terminal connected to the gate terminal of the third PMOS transistor; and a fourth NMOS transistor having a drain terminal connected to the source terminal of the third NMOS transistor, a gate terminal connected to the gate terminal of the second PMOS transistor, and a source terminal connected to a ground.

5. A circuit for generating a signal of a predetermined width in response to a transition of an input signal, comprising:

a level maintaining circuit having a plurality of transistors coupled to be responsive to the input signal such that first signals are outputted by said plurality of transistors;

a latch circuit coupled to said level maintaining circuit such that said latch circuit latches the first signals and outputs second signals;

a delay circuit receiving said second signals such that said second signals are delayed for a predetermined period of time; and an output circuit receiving delayed second signals from said delay circuit whereby said output circuit provides the signal of the predetermined width in response to the transition of the input signal, wherein said second signals and said delayed second signals are applied to said plurality of transistors of said level maintaining circuit and said output circuit.

6. The circuit of claim 5, further comprising a logic gate receiving at least one externally applied signal to output the input signal.

7. The circuit of claim 5, wherein said first signals comprise first and second level maintaining signals of different levels, and said level maintaining circuit includes:

first and second inverters receiving the input signal, and a third inverter coupled said second inverter, wherein said first and third inverters are coupled to electrode connections of said plurality of transistors whereby said first and second level maintaining signals are outputted in response to the input signal.

8. The circuit of claim 7, wherein said plurality of transistors comprises:

a first set of serially connected transistors connected to said first inverter and outputting said first level maintaining signal; and a second set of serially connected transistors connected to said third inverter and outputting said second level maintaining signal.

9. The circuit of claim 8, wherein said second signals comprise first and second latch signals and said delayed second signals comprise delayed first and second latch signals, and wherein said first set includes a first pair of transistors having control electrodes commonly connected to receive said first latch signal, and said second set includes a second pair of transistors having control electrodes commonly connected to receive said delayed second latch signal.

10. The circuit of claim 9, wherein said second set includes a third pair of transistors having control electrodes commonly connected to receive said second latch signal, and said first set includes a fourth pair of transistors having control electrodes commonly connected to receive said delayed first latch signal.

11. The circuit of claim 5, wherein said output circuit comprises:

a first group of transistors coupled to an output node and receiving a predetermined power potential; and a second group of transistors coupled to the output node and receiving a predetermined ground potential, wherein corresponding transistors of said first and second groups receive said second signals and said delayed second signal, whereby the signals of a predetermined width is generated at said output node in response to the transition of the input signal.

12. The circuit of claim 11, wherein said first group includes:

a pair of first MOS transistors connected in series, a pair of second MOS transistors connected in series, wherein said pairs of first and second MOS transistors are coupled in parallel, and a transistor from each of said pairs of first and second MOS transistors receives said delayed second signals, and others receive said second signals.

13. The circuit of claim 12, wherein said second group includes:

a pair of third MOS transistors connected in series, a pair of fourth MOS transistors connected in series, wherein said pairs of third and fourth MOS transistors are coupled in parallel, and a transistor from each said pairs of third and fourth MOS transistors receives said delayed second signal, and others receive said second signal.

14. The circuit of claim 12, wherein said second signals comprise first and second latch signals and said delayed second signals comprise delayed first and second latch signals, wherein said pair of first MOS transistors comprises a first PMOS transistor receiving said predetermined power potential and receiving said first latch signal, and a second PMOS transistor coupled to said output node and receiving said delayed first latch signal, and said pair of second MOS transistors comprises a third PMOS transistor receiving said predetermined power potential and receiving said second latch signal, and a fourth PMOS transistor coupled to said output node and receiving said delayed second latch signal.

15. The circuit of claim 13, wherein said second signals comprise first and second latch signals and said delayed second signals comprise delayed first and second latch signals, wherein said pair of third MOS transistors comprises a first PMOS transistor coupled to said predetermined ground potential and receiving said delayed second latch signal, and a second PMOS transistor coupled to said output node and receiving said first latch signal, and said pair of second MOS transistors comprises a third PMOS transistor coupled to said predetermined ground potential and receiving said delayed first latch signal, and a fourth PMOS transistor coupled to said output node and receiving said second latch signal.

16. A circuit for generating an address transition detection signal of a predetermined pulse width in response to a transition of an input signal, comprising:

a level maintaining circuit having a first set of serially connected transistors responsive to the input signal to output a first level maintaining signal and a second set of serially connected transistors responsive to the input signal to output a second level maintaining signal;

a latch circuit coupled to said level maintaining circuit such that said latch circuit latches the first and second level maintaining signals and outputs first and second latch second signals;

a delay circuit receiving said first and second latch signals such that said first and second latch signals are delayed for a predetermined period of time; and an output circuit receiving delayed first and second latch signals from said delay circuit whereby said output circuit provides the address transition detection signal of the predetermined width in response to the transition of the input signal, wherein said first latch signal and said delayed second latch signal are applied to said first set, and said second latch signal and said delayed first latch signal are applied to said second set.

17. The circuit of claim 16, further comprising a logic gate receiving at least one externally applied signal to output the input signal.

18. The circuit of claim 16, wherein said level maintaining circuit further includes:

first and second inverters receiving the input signal, and a third inverter coupled to said second inverter, wherein said first inverter is coupled to a first electrode connection between two transistors of said first set, and said third inverter is coupled to a second electrode connection of two transistors of said second set whereby said first and second level maintaining signals are outputted in response to the input signal.

19. The circuit of claim 16, wherein said first set includes a first pair of transistors having control electrodes commonly connected to receive said first latch signal, and a second set having control electrodes commonly connected to receive said delayed second latch signal.

20. The circuit of claim 19, wherein said second set includes a third pair of transistors having control electrodes commonly connected to receive said second latch signal, and a fourth pair of transistors having control electrodes commonly connected to receive said delayed first latch signal.

21. The circuit of claim 16, wherein said output circuit comprises:

a first group of transistors coupled to an output node and receiving a predetermined power potential; and a second group of transistors coupled to the output node and receiving a predetermined ground potential, wherein corresponding transistors of said first and second groups receive said first and second latch signals and said delayed first and second latch signals, whereby the address transition detection signal of a predetermined width is generated at said output node in response to the transition of the input signal.

22. The circuit of claim 16, wherein said output circuit includes:

a first group of transistors coupled to an output node and receiving a predetermined power potential, said first and second latch signals and said delayed first and second latch signals; and a second group of transistors coupled to the output node and receiving a predetermined ground potential, said first and second latch signals and said delayed first and second latch signals.

23. The circuit of claim 22, wherein said first group includes:

a first PMOS transistor receiving the predetermined power potential and said first latch signal, a second PMOS transistor coupled to the output node and receiving said delayed first latch signal, a third PMOS transistor receiving said predetermined power potential and receiving said second latch signal, and a fourth PMOS transistor coupled to said output node and receiving said delayed second latch signal.

24. The circuit of claim 22, wherein said second group includes:

a first PMOS transistor coupled to said predetermined ground potential and receiving said delayed second latch signal, a second PMOS transistor coupled to said output node and receiving said first latch signal, a third PMOS transistor coupled to said predetermined ground potential and receiving said delayed first latch signal, and a fourth PMOS transistor coupled to said output node and receiving said second latch signal.

* * * * *